US012623247B2

(12) United States Patent
Park et al.

(10) Patent No.:    US 12,623,247 B2
(45) Date of Patent:        May 12, 2026

(54) GAS SUPPLY UNIT AND SUBSTRATE PROCESSING APPARATUS INCLUDING SAME

(71) Applicant: SEMES CO., LTD., Cheonan-si (KR)

(72) Inventors: Eunwoo Park, Gyeongsan-si (KR); Jongwha Kang, Cheonan-si (KR); Wooram Lee, Seoul (KR); Sung-gyu Lee, Cheonan-si (KR); Dongwoon Park, Seoul (KR); Yongdae Cho, Namyangju-si (KR); Donghoon Kang, Bucheon-si (KR); Kisang Eum, Cheonan-si (KR)

(73) Assignee: SEMES CO., LTD., Cheonan-si (KR)

( * ) Notice:    Subject to any disclaimer, the term of this patent is extended or adjusted under 35 U.S.C. 154(b) by 667 days.

(21) Appl. No.: 18/146,740

(22) Filed:     Dec. 27, 2022

(65)              Prior Publication Data

US 2023/0201863 A1       Jun. 29, 2023

(30)         Foreign Application Priority Data

Dec. 27, 2021     (KR) ........................ 10-2021-0189021
Apr. 1, 2022      (KR) ........................ 10-2022-0040960

(51) Int. Cl.
    *B05C 5/02*          (2006.01)
    *F17D 1/04*          (2006.01)
    *H10P 72/00*         (2026.01)
(52) U.S. Cl.
    CPC .......... *B05C 5/0275* (2013.01); *B05C 5/0208* (2013.01); *F17D 1/04* (2013.01); *H10P 72/0452* (2026.01); *H10P 72/0458* (2026.01)

(58) Field of Classification Search
    CPC .............. B05C 5/0208; H01L 21/6715; H01L 21/67178; H01L 21/6719; H01L 21/67017; H01L 21/67069
    See application file for complete search history.

(56)              References Cited

U.S. PATENT DOCUMENTS

2017/0136489 A1*    5/2017   Maeda .................. G03F 7/3092
2018/0230624 A1     8/2018   Dube et al.

FOREIGN PATENT DOCUMENTS

JP        2003-158054 A      5/2003
JP        2003-178945 A      6/2003
              (Continued)

OTHER PUBLICATIONS

Kang et al. KR 10-2020-0011290 original text and translation (Year: 2020).*

(Continued)

*Primary Examiner* — Dah-Wei D. Yuan
*Assistant Examiner* — Stephen A Kitt
(74) *Attorney, Agent, or Firm* — Harness, Dickey & Pierce, P.L.C.

(57)              ABSTRACT

Provided is an apparatus for processing a substrate. The substrate processing apparatus includes: a processing unit processing a substrate; and a gas supply unit supplying gas to the processing unit, in which the gas supply unit includes a first housing having a first internal space which is in fluid communication with a processing space of the processing unit, a second housing disposed in the first internal space, and having a second internal space which is in fluid communication with the first internal space, and a gas supply duct supplying the gas to the second internal space.

20 Claims, 8 Drawing Sheets

(56) References Cited

FOREIGN PATENT DOCUMENTS

| | | | | | |
|---|---|---|---|---|---|
| JP | 2004-172223 | A | 6/2004 | | |
| JP | 2021-044455 | A | 3/2021 | | |
| JP | 2022-132016 | A | 9/2022 | | |
| KR | 100705965 | B1 | 4/2007 | | |
| KR | 2011-0072129 | A | 6/2011 | | |
| KR | 2016-0145495 | A | 12/2016 | | |
| KR | 101988457 | B1 | 6/2019 | | |
| KR | 20200011290 | A | * | 2/2020 | ......... H01L 21/6715 |
| KR | 2020-0138902 | A | 12/2020 | | |
| KR | 102201879 | B1 | 1/2021 | | |

OTHER PUBLICATIONS

Office Action dated Dec. 19, 2023 issued in corresponding Japanese Patent Application No. 2022-203124.
Korean Office Action dated Oct. 25, 2023, issued in corresponding Korean Patent Application No. 10-2022-0040960.

* cited by examiner

GAS SUPPLY UNIT AND SUBSTRATE PROCESSING APPARATUS INCLUDING SAME

CROSS-REFERENCE TO RELATED APPLICATIONS

This application claims priority to and the benefit of Korean Patent Application Nos. 10-2021-0189021 and 10-2022-0040960 filed in the Korean Intellectual Property Office on Dec. 27, 2021 and Apr. 1, 2022, the entire contents of which are incorporated herein by reference.

TECHNICAL FIELD

The present invention relates to a gas supply unit and a substrate processing apparatus including the same.

BACKGROUND ART

In order to manufacture a semiconductor device or a flat panel display panel, various processes including a photolithography process, an etching process, an ashing process, a thin-film deposition process, and a cleaning process are performed. Among the processes, the photolithography process is a process of an application film on a substrate surface by supplying a photoresist on a semiconductor substrate, performing exposure processing for the application film formed by using a mask, and then obtaining a desired pattern on the substrate by supplying a development liquid. In particular, in recent years, in order to achieve refining of a critical dimension (CD) of the pattern, high-level uniformity is required for the application film formed in an application process.

FIG. 1 is a diagram illustrating a general substrate processing apparatus that forms the application film on the substrate such as a wafer by applying the application liquid onto the substrate.

Referring to FIG. 1, the general substrate processing apparatus 1000 includes a processing unit 1100 and a gas supply unit 1300. The processing unit 1100 includes a chamber 1110 and a liquid processing module 1120. The chamber 1110 includes a base 1111 and a side wall 1113. The liquid processing module 1120 is provided in the chamber 1110, which supplies the photoresist to a rotating substrate to form the application film on the substrate surface. A plurality of liquid processing modules 1120 may be provided in the chamber 1100.

The gas supply unit 1300 supplies a gas G of which a temperature and/or a humidity are/is controlled to a space in the chamber 1110 so that the application film formed by the liquid processing module 1120 may be formed with a uniform thickness. The gas supply unit 1300 includes a main duct 1310 and a gas supply box 1320 receiving the gas G from the main duct 1310 and supplying the gas G into the chamber 1110. The space in the gas supply box 1320 is in fluid communication with the space in the chamber 1110.

One substrate processing apparatus 1000 includes a plurality of processing units 1100. The gas supply box 1320 is provided to correspond to each of the plurality of processing units 1100. The main supply duct 1310 is branched to supply the gas G to each gas supply box 1320.

The plurality of processing units 1100 are stacked on each other, and arranged in a vertical direction by considering a space of a semiconductor manufacturing line. The other one base 111 among the plurality of processing units 1100 may be disposed above the gas supply box 1320 supplying the gas G to any one of the plurality of processing units 1100. Meanwhile, the liquid processing module 1120 for processing the substrate is disposed in the chamber 1100 of the processing unit 1100 as described above. The liquid processing module 1120 includes various power generation devices for implementing an operation of processing the substrate. For example, the liquid processing module 1120 includes the power generation device such as a motor or a cylinder. The power generation device generates heat in the process of generating power. The heat generated by the power generation device is transferred to the base 1111 of the chamber 1110. The heat transferred to the base 1111 is transferred to the gas supply box 1320 disposed below the base 1111. The heat transferred to the gas supply box 1320 heats the gas G supplied to the gas supply box 1320.

FIG. 2 is a diagram illustrating any one of the gas supply boxes of FIG. 1 viewed from the top. As illustrated in FIG. 2, in the gas supply box 1320, a gas (G) temperature in a region (region A in FIG. 2) adjacent to the main duct 1310 and a gas (G) temperature in a region (region B in FIG. 2) far from the main duct 1310 may be different from each other. When the gas G is introduced into the gas supply box 1320, the gas G moves in a direction toward region B from region A, and the gas G is continuously heated in the process of moving in the direction toward region B from region A. Therefore, the gas (G) temperature in region B may be higher than the gas (G) temperature in region A. The temperature of the gas G introduced into the chamber 1100 from region B of the gas supply box 1320 is high and the temperature of the gas G introduced into the chamber 1100 from region A of the gas supply box 1320 is low. For example, the temperature of the gas G supplied into the chamber 1100 through the gas supply box 1320 may vary depending on the region in the chamber 1100.

Non-uniformity of the temperature of the gas G supplied into the chamber 110 influences a thickness of the application film formed on the substrate. For example, the thickness of the application film formed by the liquid processing module 1120 adjacent to the main duct 1310 may be different from the thickness of the application film formed by the liquid processing module 1120 far from the main duct 1310. Further, the thickness of the application film formed on the substrate may not also uniform.

SUMMARY OF THE INVENTION

An object of the present invention is to provide a gas supply unit capable of efficiently processing a substrate and a substrate processing apparatus including the same.

Further, an object of the present invention is to provide a gas supply unit comparatively equalizing a temperature of gas supplied to a processing space of a chamber and a substrate processing apparatus including the same.

Further, an object of the present invention is to provide a gas supply unit capable of improving uniformity of an application film formed on a substrate processing apparatus including the same.

A problem to be solved by the present invention is not limited to the above-described problem, and other technical problems not mentioned may be apparently appreciated by those skilled in the art from the following description.

An exemplary embodiment of the present invention provides an apparatus for processing a substrate. The substrate processing apparatus includes: a processing unit processing a substrate; and a gas supply unit supplying gas to the processing unit, in which the gas supply unit includes a first housing having a first internal space which is in fluid communication with a processing space of the processing unit, a second housing disposed in the first internal space, and having a second internal space which is in fluid communication with the first internal space, and a gas supply duct supplying the gas to the second internal space.

According to an exemplary embodiment, the second housing may include an injection unit having at least one hole in which the gas flows, and a duct unit disposed between the injection unit and the gas supply duct, and having one end connected to the injection unit.

According to an exemplary embodiment, a plurality of holes may be formed in the injection unit.

According to an exemplary embodiment, the injection unit may be disposed at a central region of the first internal space.

According to an exemplary embodiment, the injection unit may have a cylindrical shape, and the hole may be formed at a side portion of the injection unit.

According to an exemplary embodiment, the processing unit may include a first processing unit, and a second processing unit disposed below the first processing unit, and the first housing and the second housing may be disposed between the first processing unit and the second processing unit.

According to an exemplary embodiment, the first housing may be installed so that a top surface is spaced apart from a bottom surface of the first processing unit.

According to an exemplary embodiment, the gas supply unit may further include a fixation means made of a heat insulating material, which fixes the first housing to the first processing unit.

According to an exemplary embodiment, the gas supply unit may further include a heat insulating pad installed between the first housing and the first processing unit, and made of the heat insulating material.

According to an exemplary embodiment, the gas supply unit may further include a flow rate control damper controlling a supply flow rate of gas per time, which is supplied to the processing space.

Further, another exemplary embodiment of the present invention provides a gas supply unit supplying a gas of which a temperature or humidity is controlled to a processing unit processing a substrate. The gas supply unit may include: a gas supply housing having a dual chamber structure, and having an internal space which is in fluid communication with a processing space of the processing unit; and a gas supply duct supplying the gas to the gas supply housing.

According to an exemplary embodiment, the gas supply housing may include a first housing having a first internal space, in which at least one perforated hole which makes the first internal space and the processing space be in fluid communication with each other is formed on a surface facing the processing space of the first housing, and a second housing disposed in the first internal space, and having a second internal space into which the gas is introduced from the gas supply duct.

According to an exemplary embodiment, the second housing may include an injection unit having at least one hole which makes the second internal space and the first internal space be in fluid communication with each other, and a duct unit disposed between the injection unit and the gas supply duct.

According to an exemplary embodiment, the holes may be formed at an upper portion, a side portion, and a lower portion of the injection unit.

According to an exemplary embodiment, the gas supply unit may further include a filter disposed between the perforated hole and the second housing, and filtering the gas.

According to an exemplary embodiment, the gas supply unit may further include a flow rate control damper controlling a supply flow rate of gas per time, which is supplied to the processing space.

Further, yet another exemplary embodiment of the present invention provides an apparatus for processing a substrate. The substrate processing apparatus may include: a processing unit forming a liquid layer on a substrate by supplying an application liquid to the substrate; and a gas supply unit supplying gas to the processing unit, in which the processing unit may include a chamber having a processing space, a bowl having a cylindrical shape of which an upper portion is opened, a chuck supporting the substrate in the bowl, a driver rotating the chuck, a nozzle supplying the application liquid to the substrate supported on the chuck, and an exhaust pipe exhausting the gas introduced into the bowl, and the gas supply unit may include a gas supply housing having a dual chamber structure, and having an internal space which is in fluid communication with the processing space, and a gas supply duct supplying the gas to the internal space.

According to an exemplary embodiment, the gas supply housing may include a first housing having a first internal space which is in fluid communication with the processing space, and a second housing disposed in the first internal space, and having a second internal space which is in fluid communication with the first internal space, and the second housing may include an injection unit having at least one hole in which the gas flows, and a duct unit disposed between the injection unit and the gas supply duct, and having one end connected to the injection unit, and the injection unit may be disposed at a central region of the first internal space.

According to an exemplary embodiment, a plurality of processing units may be provided, and a plurality of gas supply housings may be provided.

According to an exemplary embodiment, the gas supply duct may be configured to supply the gas to at least two gas supply housings.

According to an exemplary embodiment of the present invention, a substrate can be efficiently processed.

Further, according to an exemplary embodiment of the present invention, a temperature of gas supplied to a processing space of a chamber can be comparatively uniform.

Further, according to an exemplary embodiment of the present invention, the uniformity of an application film formed on the substrate can be improved.

The effect of the present invention is not limited to the foregoing effects, and non-mentioned effects will be clearly understood by those skilled in the art from the present specification and the accompanying drawings.

DETAILED DESCRIPTION

Figure 1:
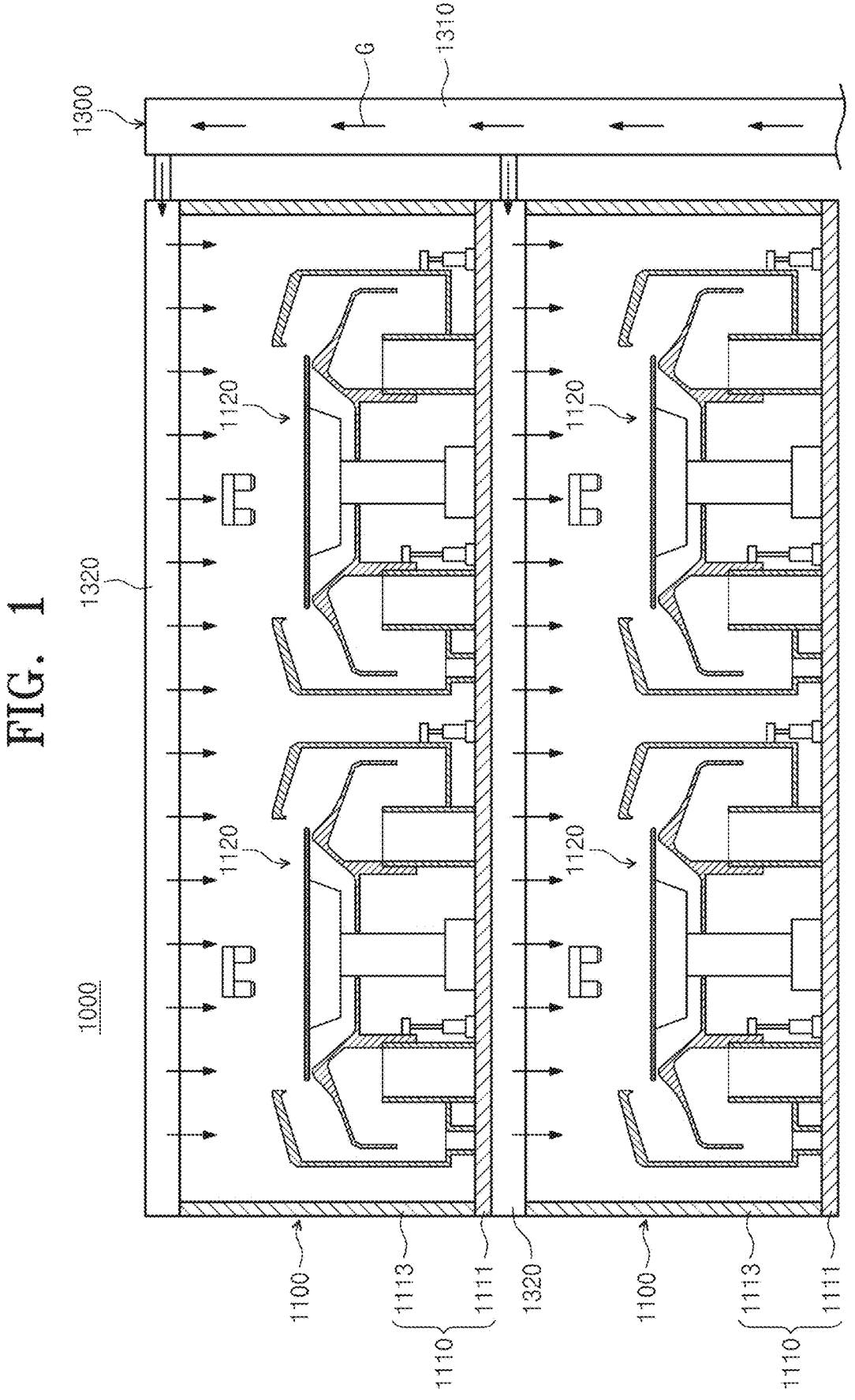
FIG. 1 is a diagram illustrating a general substrate processing apparatus that forms the application film on the substrate such as a wafer by applying the application liquid onto the substrate.
Figure 2:
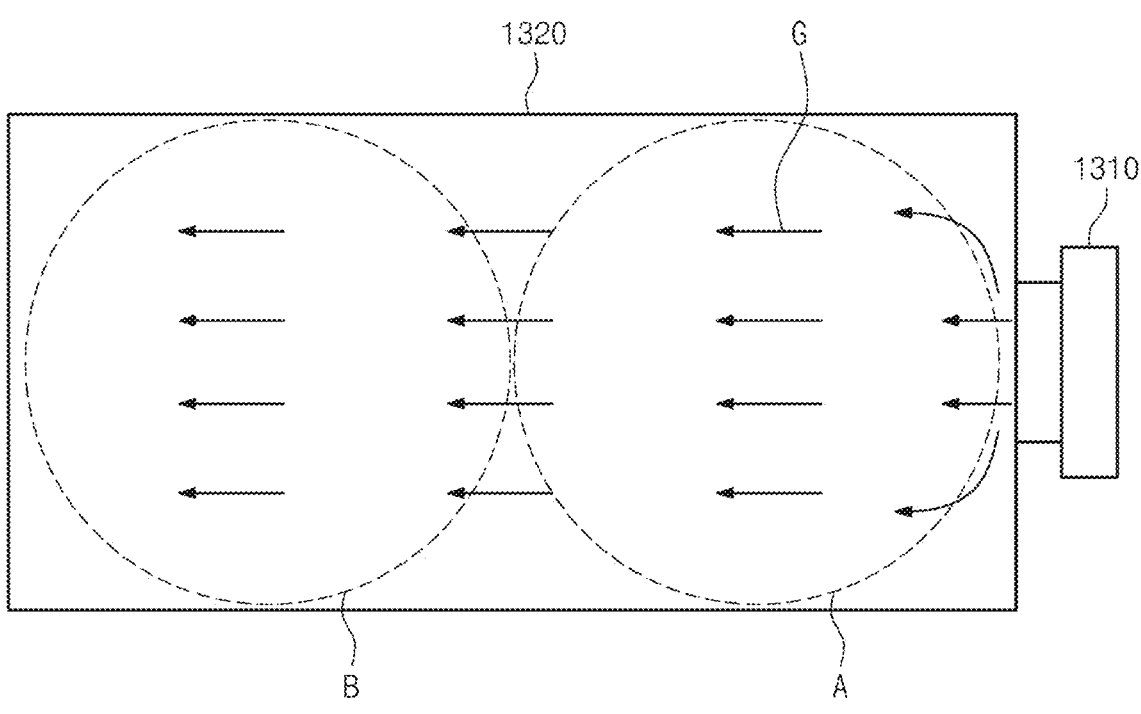
FIG. 2 is a diagram illustrating any one of the gas supply boxes of FIG. 1 viewed from the top.

In the following detailed description, exemplary embodiments of the present invention have been shown and described, simply by way of illustration. As those skilled in the art would realize, the described exemplary embodiments may be modified in various different ways, all without departing from the spirit or scope of the present invention. Further, in describing the exemplary embodiment of the present invention, detailed description of associated known function or constitutions will be omitted if it is determined that they unnecessarily make the gist of the present invention unclear. Further, the same reference numeral is used for a part which performs a similar function and a similar action through all drawings.

Unless explicitly described to the contrary, the word "include" and variations such as "includes" or "including" will be understood to imply the inclusion of stated elements but not the exclusion of any other elements. In the present application, it should be understood that term "include" or "have"indicates that a feature, a number, a step, an operation, a component, a part or the combination thereof described in the specification is present, but does not exclude a possibility of presence or addition of one or more other features, numbers, steps, operations, components, parts or combinations thereof, in advance. A singular form includes a plural form if there is no clearly opposite meaning in the context. Further, shapes, sizes, and the like of elements in the drawings may be exaggerated for clearer explanation.

Figure 3:
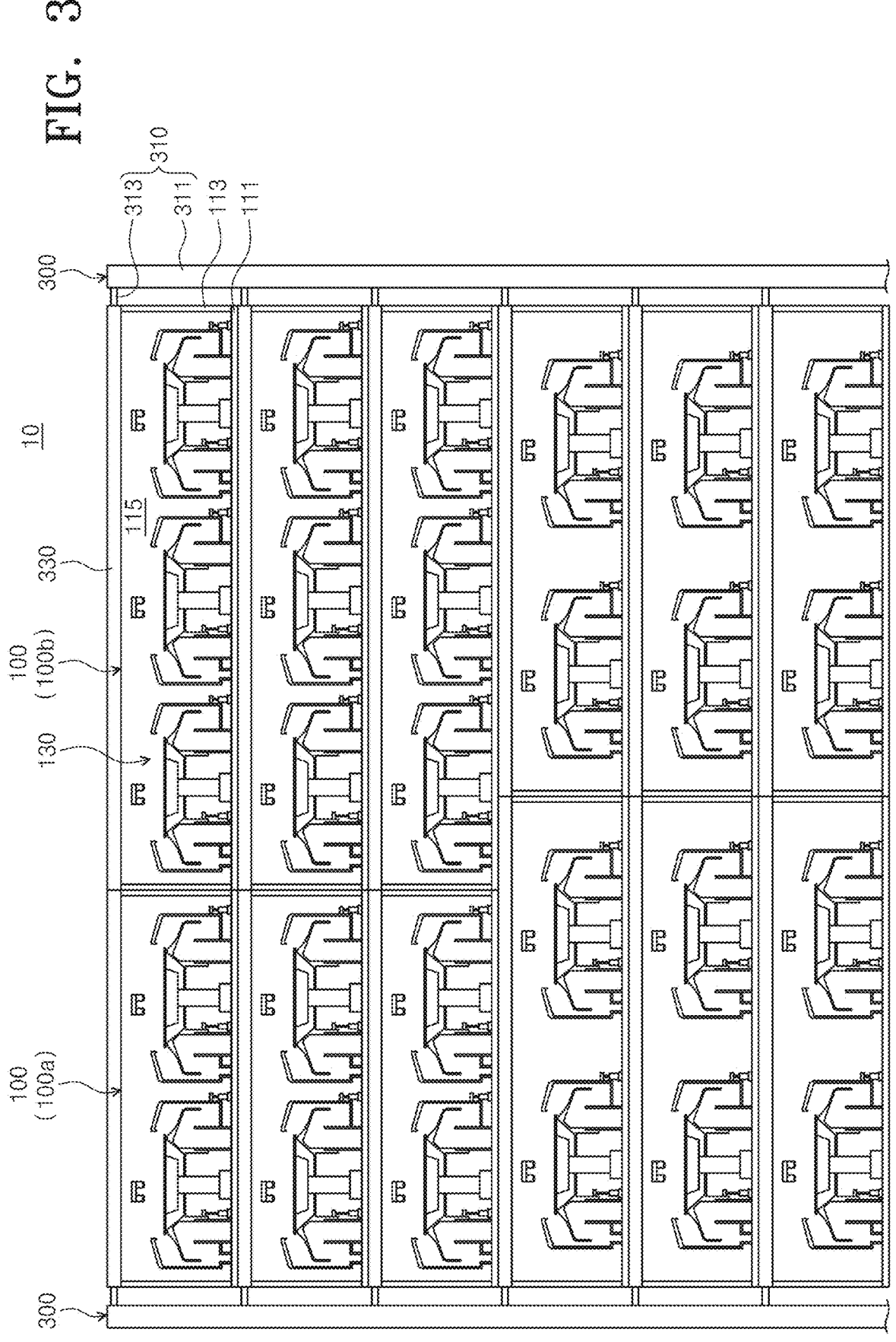
FIG. 3 is a cross-sectional view illustrating a substrate processing apparatus according to an exemplary embodiment of the present invention viewed from the side.

Hereinafter, a gas supply unit and a substrate processing apparatus including the same according to an exemplary embodiment of the present invention will be described in detail. FIG. 3 is a cross-sectional view illustrating a substrate processing apparatus according to an exemplary embodiment of the present invention viewed from the side. Referring to FIG. 3, the substrate processing apparatus 10 according to an exemplary embodiment of the present invention may include a processing unit 100 and a gas supply unit 300.

The processing unit 100 may perform a processing process of processing the substrate W. The processing unit 100 may perform the processing process of processing the substrate W by supplying a processing liquid to the substrate W. The processing unit 100 may perform the processing process of processing the substrate W by supplying an application liquid to the substrate W. For example, the processing unit 100 may perform an application process of forming a photoresist layer or an anti reflective coating layer (ARC) on the substrate W by supplying the photoresist to the substrate W. Further, the processing unit 100 may perform a development process of processing the substrate W which is exposure-processed by supplying a development liquid to the substrate W. Further, although not illustrated, the substrate processing apparatus 10 may further include a bake unit that performs a heating process of stabilizing a thin film on the substrate W by heating-processing the substrate W.

As an example, any one of the processing units 100 may perform a first application process of forming the thin film on the substrate W. In the first application process, the application liquid is supplied to form the anti reflective coating layer (ARC) on the substrate W. Thereafter, the bake unit may perform an ARC bake process of stabilizing the anti-reflective coating layer (ARC). Thereafter, the other one of the processing units 100 may perform a second application process of forming the thin film on the substrate W. In the second application process, the application liquid is supplied to form the photoresist layer on the substrate W. Thereafter, the bake unit may perform a soft bake process of stabilizing the photoresist layer. In the soft bake process, a solvent component which may remain on the substrate W may be evaporated.

After the soft bake process is performed, the substrate W may be exposure-processed by an exposure apparatus not illustrated. After the exposure is performed, the bake unit may perform a post exposure bake process of flattening the surface of the photoresist layer, and improving standing wave (a wave generated on a photoresist layer interface due to interference of light upon exposure processing). Thereafter, another one of the processing units 100 may perform the development process for the substrate W by supplying the development liquid onto the substrate W. After the development process is performed, the bake unit may perform a hard bake process for the substrate W. The hard bake process may be a hard bake process of removing the solvent and the development liquid which remain on the substrate W, and enhancing thermal characteristics of the photoresist layer. The ARC bake process, the soft bake process, the post exposure back process, and the hard bake process may be performed in one bake unit or also performed in different bake units. The substrate processing apparatus 10 may include at least one processing unit 100. For example, the substrate processing apparatus 10 may include a plurality of processing units 100. Some of the processing units 100 may be arranged in line in a horizontal direction. Other some of the processing units 100 may be arranged in line in the vertical direction. The processing units 100 may be stacked and provided in the vertical direction. The number of processing units 100 may be variously transformed by considering an area of the semiconductor manufacturing line in which the substrate processing apparatus 10 is disposed, the number of substrates W required to be processed per time, etc.

Further, each processing unit 100 may include the chamber 110 and the liquid processing module 130. The chamber 110 may include the base 111 and the side wall 113. The base 111 and the side wall 113 are combined with each other to define at least a part of the processing space 115 of processing the substrate W. The base 111 may be a bottom of the chamber 110. The side wall 113 may be a side of the chamber 110. The base 111 may include a space in which an interface line for driving the liquid processing module 130 to be described below is provided. Further, the base 111 may include a space in which one component of a pipe assembly 160 of the liquid processing module 130 to be described below may be disposed.

The processing unit 100 may include the liquid processing module 130 performing liquid-processing for the substrate W. The processing unit 100 may include at least one liquid processing module 130. For example, the processing unit 100 may include a plurality of liquid processing modules 130. That is, in the processing unit 100, the plurality of liquid processing modules 130 may be disposed in the processing space 115 of the chamber 110. Some 100*a* of the processing units 100 may include two liquid processing modules 130, and other some 100*b* of the processing units 100 may include three liquid processing modules 130. However, this is one example, and the number of liquid processing modules 130 may be variously transformed according to a layout of the processing units 100 and an area occupied by the processing units 100.

Figure 4:
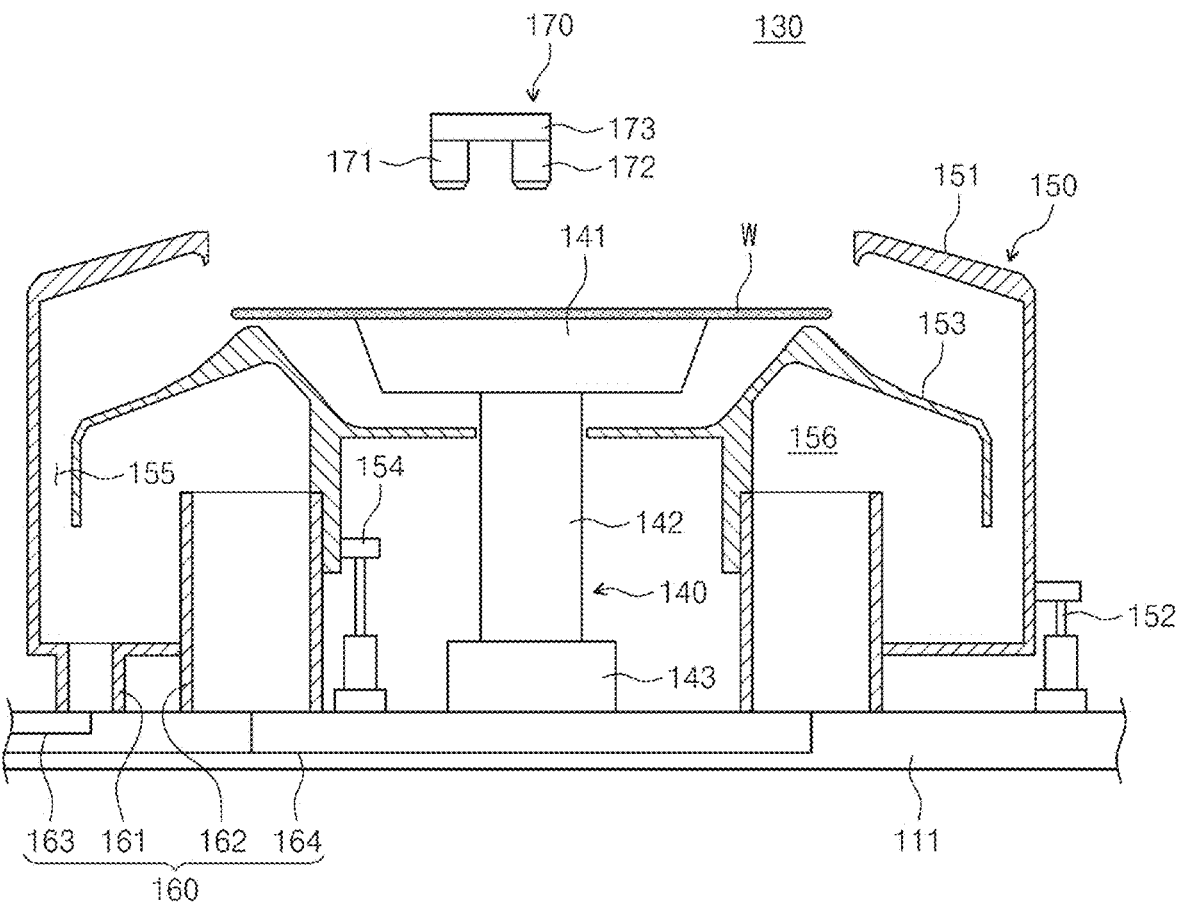
FIG. 4 is a diagram illustrating a liquid processing module of a processing unit of FIG. 3.

FIG. 4 is a diagram illustrating a liquid processing module of a processing unit of FIG. 3. Hereinafter, a processing module 130 performing the first application process or second application process among the processing units 100 will be described as an example. Further, a structure of the liquid processing module 130 performing the development process may be the same as or similar to the liquid processing module 130 performing the first application process or second application process.

Referring to FIG. 4, the liquid processing module 130 of the processing unit 100 according to an exemplary embodiment of the present invention may include a chuck assembly 140, a bowl assembly a pipe assembly 160, and a liquid supply assembly 170.

The chuck assembly 140 may support and rotate the substrate W. The chuck assembly 140 may support and/or rotate the substrate W while the processing liquid (e.g., an application liquid of forming the photoresist layer or the ARC layer) is supplied to the substrate W. The chuck assembly 140 may include a chuck 141, a rotary axis 142, and a driver 143. The chuck 141 may have a seating surface supporting the substrate W. Further, the chuck 141 may support and rotate the substrate W within the bow assembly 150 to be described below. The seating surface of the chuck 141 may support a bottom surface of the substrate W. When the chuck 131 is viewed from the side, the chuck 141 may have a shape in which an area of a top surface is larger than an area of a bottom surface. The chuck 141 may have a wide top and narrow bottom shape. When the chuck 131 is viewed from the top, the chuck 141 may have a smaller diameter than the substrate W. Therefore, a central region of the substrate W may be supported on the chuck 141, and an edge region of the substrate W may protrude to the outside of the chuck 141. The chuck 141 may be configured to chuck the substrate W by a vacuum adsorption scheme. However, the chuck 141 is not limited thereto, and the chuck 141 may be transformed to various forms capable of chucking the substrate W. For example the chuck 141 may include a plurality of chucking pins supporting the side of the substrate W, and the chucking pins may also chuck the substrate W by applying a force to the side of the substrate W toward the center of the substrate W.

The chuck 141 may be connected to one end of the rotary axis 142. The rotary axis 142 may be a hollow axis. The rotary axis 142 rotates the chuck 141 to rotate the substrate W placed on the chuck 141. The rotary axis 142 may be connected to the driver 143 which may be a hollow motor. The driver 143 may rotate the chuck 141. The driver 143 may generate a power for rotating the rotary axis 142. In the above-described example, it is described as an example that the driver 143 is the hollow motor, but the present invention is not limited thereto. For example, the type of driver 143 may be variously transformed to a known power generation device.

The bowl assembly 150 may recover the processing liquid supplied from the liquid supply assembly 170 to be described below and discharge the processing liquid to the outside of the substrate processing apparatus 10. The processing liquid supplied from the liquid supply assembly 170 may be scattered to the outside of the substrate W by the rotating substrate W. The bowl assembly 150 may recover the processing liquid scattered to the outside of the substrate W and discharge the processing liquid to the outside of the substrate processing apparatus 10. The bowl assembly 150 may suction the gas supplied by the gas supply unit 300 to be described below and discharge the gas to the outside of the substrate processing apparatus 10.

The bowl assembly 150 may include an outer bowl 151, an outer bowl elevator 152, an inner bowl 153, and an inner bowl elevator 154. The outer bowl 151 may have a cylindrical shape of which an upper portion is opened. The outer bowl 151 may include a bottom portion, a wall portion extending from the bottom portion in a vertical direction, and an inclination portion provided to be inclined toward the center of the substrate W from the wall portion. The outer bowl elevator 152 may elevate the outer bowl 151 in the vertical direction. The outer bowl elevator 152 may be a pneumatic cylinder or a hydraulic cylinder, or may be provided as the power generation device such as the motor.

The inner bowl 153 may be disposed within the outer bowl 151. The inner bowl elevator 154 may elevate the inner bowl 153 in the vertical direction. The inner bowl elevator 154 may be the pneumatic cylinder or the hydraulic cylinder, or may be provided as the power generation device such as the motor.

The inner bowl 153 is combined with the outer bowl 151 to define a drain path in which the processing liquid is discharged or an exhaust path for exhausting the gas supplied by the gas supply unit 300. The inner bowl 153 is combined with the outer bowl 151 to define a drain space 155 which may be a part of the drain path. The drain space 155 may face a drain pipe 161 to be described below. The inner bowl 153 may define a buffer space 156 which may be a part of the exhaust path. The buffer space may face an exhaust pipe 162 to be described below.

While the processing liquid is supplied to the substrate W, the outer bowl elevator 152 and the inner bowl elevator 154 may control heights of the outer bowl 151 and the inner bowl 153 so that the processing liquid scattered from the substrate W is recovered between the outer bowl 151 and the inner bowl 153.

The pipe assembly 160 may include the drain pipe 161, the exhaust pipe 162, a drain line 163, and an exhaust line 164.

The drain pipe 161 may face the drain space 155. The processing liquid supplied by the liquid supply assembly 170 may be recovered along the drain path between the inner bowl 153 and the outer bowl 151, and the recovered processing liquid may be introduced into the drain pipe 161 via the drain space 155. The processing liquid introduced into the drain pipe 161 may be discharged to the outside through the drain line 163 connected to the drain pipe 161.

The exhaust pipe 162 may exhaust the gas introduced into the bowl assembly 150 to the outside of the substrate processing apparatus 10. The exhaust pipe 162 may face the buffer space 156. The gas supplied by the gas supply unit 300 to be described below may flow along the exhaust path (the exhaust path may partially overlap with the drain path)

between the inner bowl 153 and the outer bowl 151, and the gas may be introduced into the exhaust pipe 162 via the buffer space 156. The gas introduced into the exhaust pipe 162 may be discharged to the outside through the exhaust line 164 connected to the exhaust pipe 162. Further, the exhaust line 164 and the drain line 163 may be provided to the space within the base 111.

The liquid supply assembly 170 may supply the processing liquid to the substrate W which rotates while being supported on the chuck assembly 140. The liquid supply assembly 170 may include a first nozzle 171, a second nozzle 172, and a nozzle arm 173. The first nozzle 171 may supply a first processing liquid to the substrate W. The second nozzle 172 may supply a second processing liquid to the substrate W. The nozzle arm 173 is connected to a driving device not illustrated to change locations of the first nozzle 171 and the second nozzle 172. The processing liquid supplied by the first nozzle 171 may be a pre-wet liquid. The pre-wet liquid may be a thinner that changes a surface property of the substrate W to have hydrophobicity. The processing liquid supplied by the second nozzle 172 may be the application liquid. The application liquid may be a photosensitive liquid such as the photoresist. The application liquid may be the application liquid of forming the ARC layer. However, the processing liquid supplied by the second nozzle 172 is not limited thereto, and the type of processing liquid supplied by the second nozzle 172 may be variously transformed.

Referring back to FIG. 3, the gas supply unit 300 may supply the gas to the processing unit 100. The gas supplied by the gas supply unit 300 may be a gas of which the temperature and/or humidity are/is controlled. The gas supplied by the gas supply unit 300 may be clean dry air (CDA).

The gas supply unit 300 may include a gas supply duct 310, a gas supply housing 330, a fixation means 350, and a heat insulating pad 360. At least one gas supply housing 330 may be provided. For example, a plurality of gas supply housings 330 may be provided, and provided to correspond to the respective processing units 100. The gas supply housing 330 may be configured to supply the gas to the processing space 115 within the chamber 110 which each processing unit 100 has. The gas supply housing 330 may be one of the components defining the processing space 115. The gas supply housing 330 is disposed above the liquid supply module 130 to form a descending air current heading to the liquid supply module 130. The descending air current may be formed by the gas supplied by the gas supply housing 330.

The gas supply housing 330 may be disposed between adjacent processing units 100. The gas supply housing 330 may be disposed between processing units 100 disposed in the vertical direction. For example, when a processing unit disposed at an upper portion is referred to as a first processing unit and a processing unit 100 disposed below the first processing unit is referred to as a second processing unit, the gas supply housing 330 may be disposed between the first processing unit and the second processing unit.

The gas supply duct 310 may supply the gas of which the temperature and/or humidity are/is controlled to each gas supply housing 330. A plurality of gas supply ducts 310 may be provided. The gas supply duct 310 may include a first gas supply duct disposed at one side of the substrate processing apparatus 10 and a second gas supply duct disposed at the other side of the substrate processing apparatus 10. The first gas supply duct may supply the gas to gas supply housings 330 adjacent to the first gas supply duct, and the second gas supply duct may supply the gas to gas supply housings 330 adjacent to the second gas supply duct.

The gas supply duct 310 may include a main duct 311, and a branch duct 313. In the gas supply duct 310, the main duct 311 may extend in the vertical direction. The main duct 311 may receive the gas of which the temperature and/or humidity are/is controlled from a gas supply source (not illustrated). The temperature of the gas supplied by the gas supply source may be controlled 20 to 25° C. (preferably 23° C.) and the humidity of the gas may be controlled to 40 to 50% (preferably, 45%).

The branch duct 313 may be branched from the main duct 311. One end of the branch duct 313 may be connected to the gas supply housing 330 and the other end may be connected to the main duct 311. The branch duct 313 may be provided as a separate component from the main duct 311, which are attached to each other by a scheme such as welding. Alternatively, the branch duct 313 may also be provided as an integrated component with the main duct 311. The branch duct 313 may receive the gas of which the temperature and/or humidity are/is controlled from the main duct 311, and transfer the gas to the gas supply housing 330. The gas transferred to the gas supply housing 330 is transferred to the processing space 115 of the processing unit 100 to form a descending air current.

Figure 5:
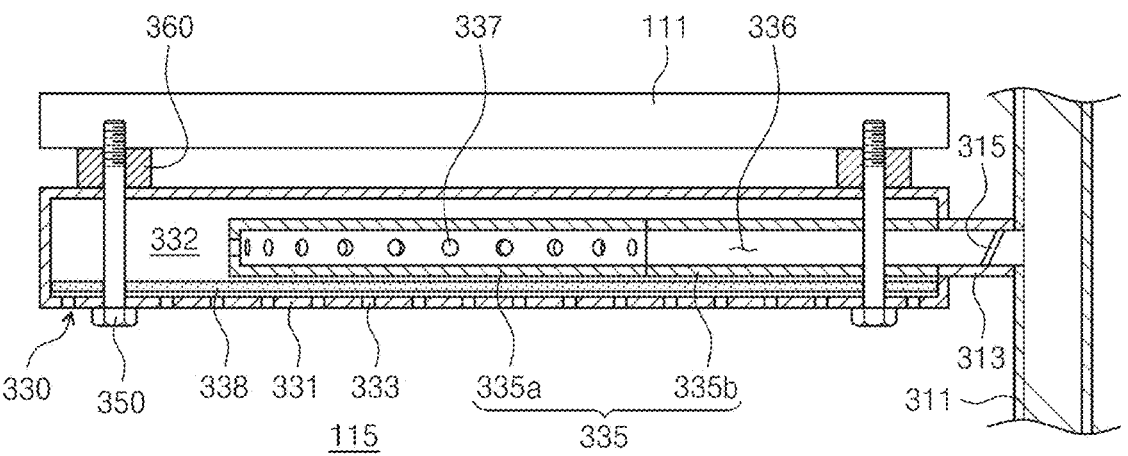
FIG. 5 is a diagram illustrating a gas supply unit of FIG. 3.
Figure 6:
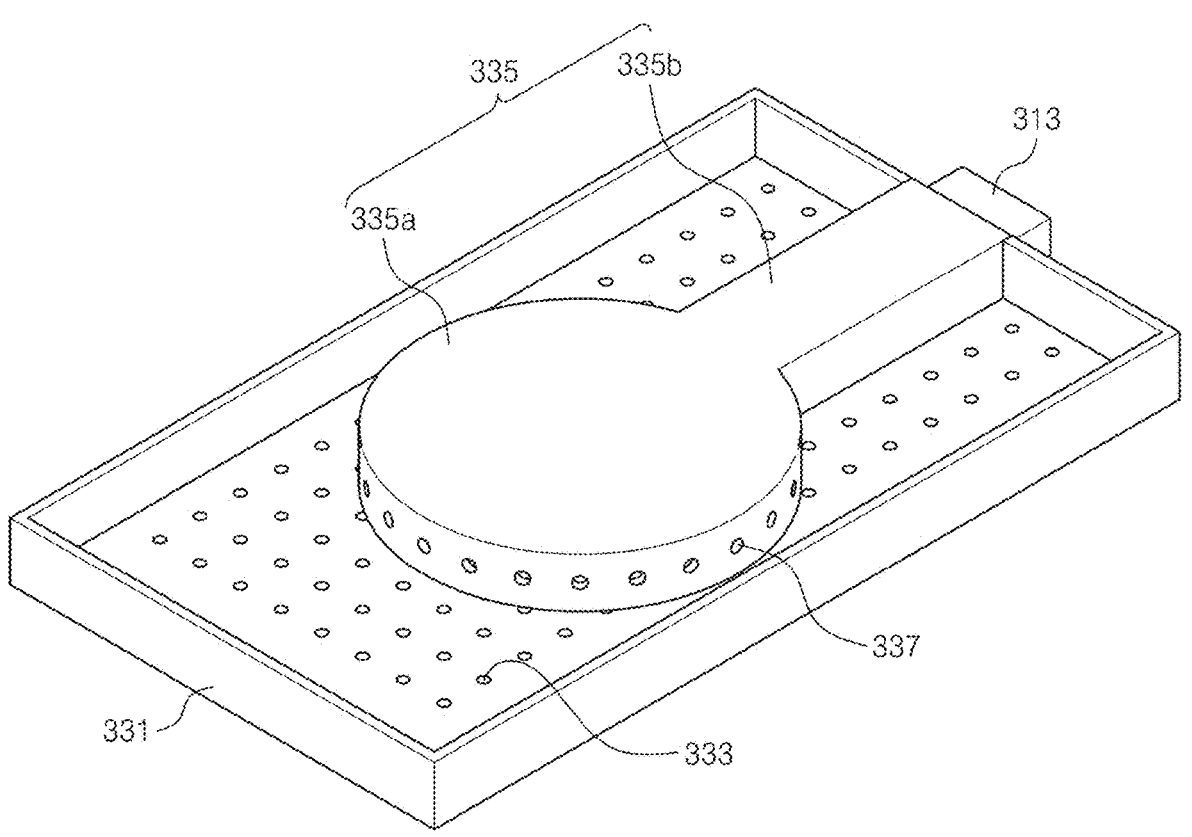
FIG. 6 is a diagram illustrating the inside of a gas supply housing of the gas supply unit of FIG. 5.

FIG. 5 is a diagram illustrating a gas supply unit of FIG. 3 and FIG. 6 is a diagram illustrating the inside of a gas supply housing of the gas supply unit of FIG. 5. In FIG. 6, in order to more clearly express the structure of the gas supply housing 330, the gas supply housing 330 is illustrated with components such as a filter 338 and a fixation means 350 being omitted.

Referring to FIGS. 5 and 6, a flow rate control damper 315 may be installed within the branch duct 313, which is a flow rate control member controlling a supply flow rate per time of the gas supplied to the processing space 115. The flow rate control damper 315 may control the air flow rate per time of a gas G supplied to a second internal space 336 by controlling an opening rate of the branch duct 313. Further, the gas supply housing 330 may be fixed to the base 111 of the processing unit 100 disposed at the upper portion by the fixation means 350. The fixation mean 350 may be a bolt or a screw. The fixation means 350 may be provided with a metallic material. The fixation means 350 may be provided with a stainless steel. However, the fixation means 350 is not limited thereto, and the fixation means 350 may also be provided with a heat insulating material having low thermal conductivity, e.g., an urethane or PEEK material. Further, in the fixation means 350, a portion exposed to a first internal space 332 to be described below may be coated with a material having corrosion resistance to the gas supplied by the gas supply unit 300. Further, the heat insulating pad 360 may be installed between the gas supply housing 330 and the base 111. The heat insulating pad 360 may have a ring shape, and the fixation means 350 may be inserted into the heat insulating pad 360. The heat insulating pad may be provided with the heat insulating material having low thermal conductivity, e.g., the urethane or PEEK material.

Further, the gas supply housing 330, more specifically, a top surface of a first housing 331 included in the gas supply housing 330 may be installed in the base 111 by the fixation means 350 to be spaced apart from the bottom surface of the base 111. This is to minimize transferring of the heat transferred to the base 111 to the gas supply housing 330.

The gas supply housing 330 may include the first housing 331 (one example of an outer housing), a second housing 335 (one example of an inner housing), and a filter 338. The first housing 331 may be an outer chamber of the gas supply housing 330, and the second housing 335 may be an inner chamber of the gas supply housing 330. That is, the gas supply housing 330 may be a dual chamber structure.

The first housing 331 as the outer chamber may have the first internal space. The second housing 335 which is the inner chamber may be disposed in the second internal space 332. The second housing 335 may be a housing into which the gas supplied from the gas supply duct 310 is introduced.

At least one perforated hole 333 which makes the first internal space 332 and the processing space 115 be in fluid communication with each other may be formed on the bottom surface of the first housing 331, specifically, a surface facing the processing space 115 of the processing unit 100 disposed at the lower portion. That is, the first housing 331 may include a perforated hole plate with the perforated hole 333.

The second housing 335 may include the second internal space 336 which is the space into which the gas supplied by the gas supply duct 310 is introduced. Further, the second housing 335 may include an injection unit 335a and a duct unit 335b. The injection unit 335a may have a substantially circular shape when viewed from the top. The duct unit 335a is disposed between the injection unit 335 and the branch duct 313 to transfer the gas supplied by the gas supply duct 310 to the injection unit 335a.

The duct unit 335b may be extended from the injection unit and connected to the branch duct 313 of the gas supply duct 310. The injection unit 335a may be disposed at a central region of the first internal space 332. When the injection unit 335a is viewed from the top and viewed from the cross-section of the gas supply housing 330, the injection unit 335a may be displayed at the central region of the first internal space 332.

Further, at least one hole 337 may be formed in the injection unit 335a, which makes the second internal space 336 and the first internal space 332 be in fluid communication with each other. For example, a plurality of holes 337 may be formed in the injection unit 335a. For example, the holes 337 may be formed in the upper portion, the side portion, and the lower portion of the injection unit 335a. The holes 337 may be formed at the side portion of the injection unit 335a to be spaced apart from each other at an equal interval to each other. The holes 337 may be formed at the side portion of the injection unit 335a, and formed to be spaced apart from each other in a circumferential direction of an outer periphery of the injection unit 335a viewed from the top.

Further, the filter 338 may be disposed between the perforated hole plates of the first housing 335 and the first housing 331. The filter 338 may be a high efficiency particulate air filter (HEPA FILTER). The filter 338 may be disposed between the perforated hole 333 and the second housing 335, and may filter the gas introduced into the processing space 115.

Figure 7:
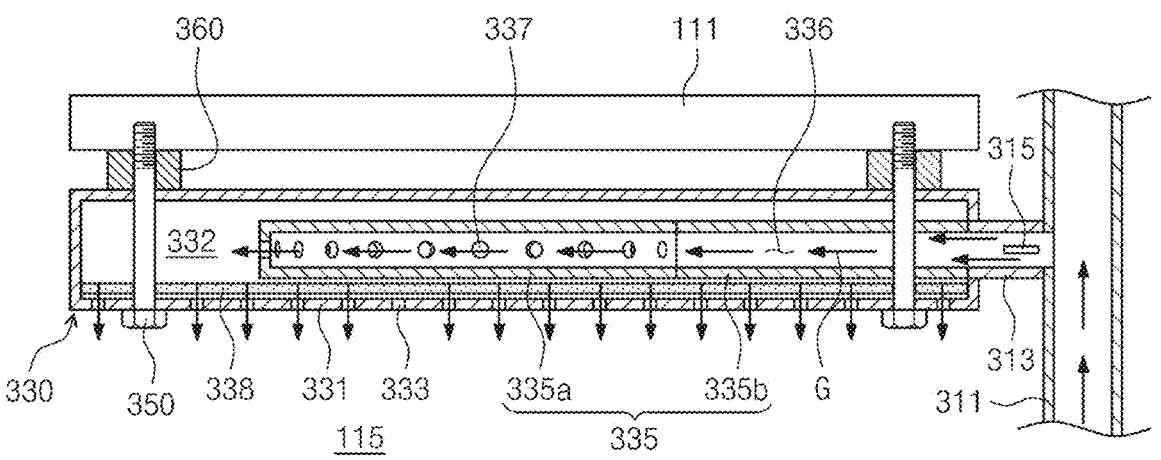
FIGS. 7 and 8 are diagrams illustrating a view in which the gas supply unit supplies gas to a processing space of a chamber.
Figure 8:
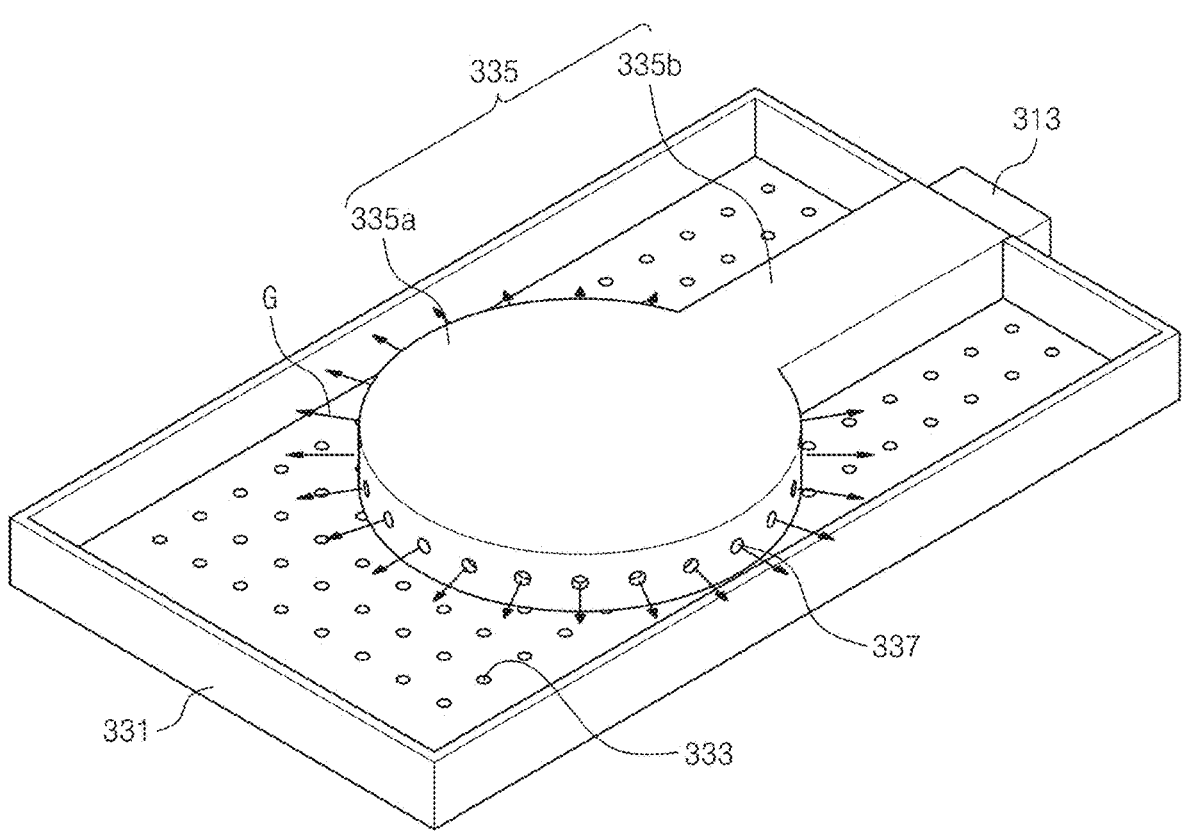

FIGS. 7 and 8 are diagrams illustrating a view in which the gas supply unit supplies gas to a processing space of a chamber. Referring to FIGS. 7 and 8, the gas G supplied by the gas supply duct 310 may be transferred to each branch duct 313 through the main duct 311, and the gas G transferred to the branch duct 313 may be transferred to the internal spaces 332 and 336 of the gas supply housing 330 connected to the branch ducts 313, respectively. The gas G transferred to the branch duct 313 may be introduced into the second internal space 336, and the gas G introduced into the second internal space 336 may be introduced into the first internal space 332 through the hole 337. The gas introduced into the first internal space 332 may be introduced into the processing space 115 via the filter 338 and the perforated hole 333. The gas G supplied to the processing space 115 may form the descending air current in the processing space 115. The gas G supplied to the processing space 115 may be introduced into the exhaust path of the bowl assembly 150, and the gas G introduced into the exhaust path may be exhausted to the outside through the exhaust pipe 162 via the buffer space 156.

According to an exemplary embodiment of the present invention, the gas G supplied by the gas supply duct 310 is introduced into the injection unit 335a via the duct unit 335b. That is, the gas G may be introduced into the injection unit 335a disposed at the central region of the first internal space 332 through the duct unit 335b, and injected to the central region of the first internal space 332. As described above, the gas introduced from the main duct 1310 is transferred to a gas supply box 1320, and the gas transferred to the gas supply box 1320 is continuously heated while flowing in a direction far away from the main duct 1310. Therefore, there is a problem in that the temperature of the gas G in a region adjacent to the main duct 1310 and the temperature of the gas G in a region far from the main duct 131 are different from each other in the gas supply box 1320. However, according to an exemplary embodiment of the present invention, the gas supply housing 330 has the dual chamber structure, and the gas G supplied to the gas supply housing 330 is injected from the central region of the first housing 331, and then diffused in the first internal space 332 and introduced into the processing spaced 115. That is, since a gas G eccentrically supplied based on a location of the gas supply duct 310 is linearly injected into the central region of the first internal space 332, and the gas G is subsequently introduced into the processing space 115, an influence of an external heat generation source (e.g., the driver 143 of the processing unit 100 disposed above the gas supply housing 330) is minimized to uniformly supply the gas G of which the temperature and/or humidity are/is controlled to the processing space 115. Therefore, a temperature deviation of the gas G introduced into the processing space 115 may be improved.

When the temperature deviation of the gas G introduced into the processing space 115 is improved, the uniformity of the thickness of the thin film formed on the substrate W may also be improved. Specifically, when a left-right temperature deviation is equal to or higher than $0.1°$ C. based on the bowl assembly 150, the left-right temperature deviation may influence the thickness of the thin film formed on the substrate W, and the present invention may improve a problem in that a temperature deviation of the gas G introduced into the processing space 115 is improved (specifically, the left-right temperature deviation is managed to be less than $0.1°$ C. based on the bowl assembly 150), and as a result, the thickness of the thin film formed on the substrate W is not uniform.

Further, one processing unit 100 may include a plurality of liquid processing modules 130 as described above, and since the temperature deviation of the gas G supplied to one processing space 115 is improved, a thickness deviation of the thin film on the substrate W formed in the respective liquid processing modules 130 may also be improved (i.e., a degree of the thickness deviation may be reduced). That is, the uniformity (also referred to as Tool To Tool Matching (TTTM)) of a processing degree between the liquid processing modules 130 may be improved.

Further, the gas supply housing 330 is installed so that the top surface is spaced apart from the bottom surface of the base 111 as described above. Therefore, the heat of the base 111 is transferred to the gas supply housing 330 to minimize influencing the temperature of the gas G supplied by the gas supply housing 330. Further, the heat insulating pad 360 is provided between the gas supply housing 330 and the base 111 as described above to minimize the transferring of the heat of the base 11 to the gas supply housing 330.

Figure 9:
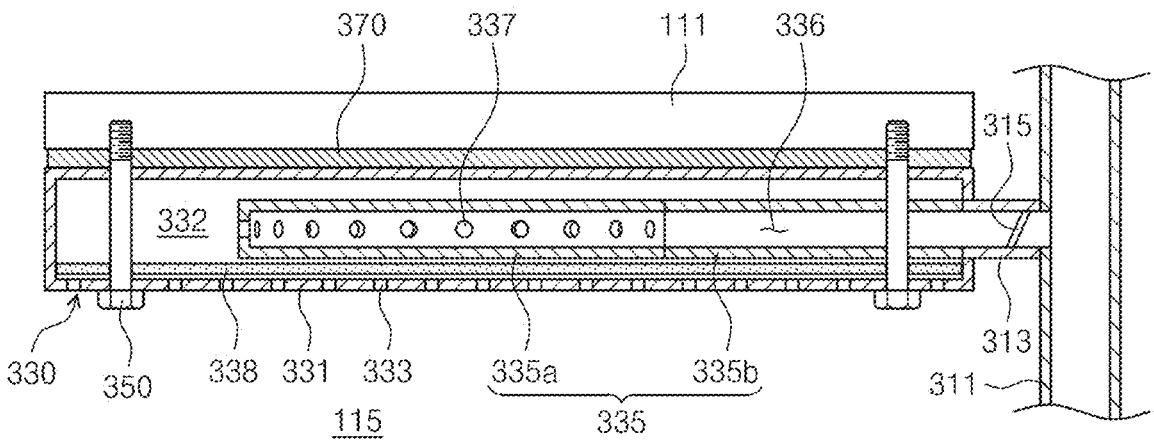
FIG. 9 is a diagram illustrating a view of a gas supply unit according to another exemplary embodiment of the present invention.

In the above-described example, it is described as an example that the ring-shaped heat insulating pad 360 is disposed between the gas supply housing 330 and the base 111, but the present invention is not limited thereto. For example, as illustrated in FIG. 9, a plate-shaped heat insulating plate 370 may be disposed between the gas supply housing 330 and the base 111. The heat insulating plate 370 may be provided with the heat insulating material, e.g., the material such as urethane or PEEK similarly to the heat insulating pad 360.

Figure 10:
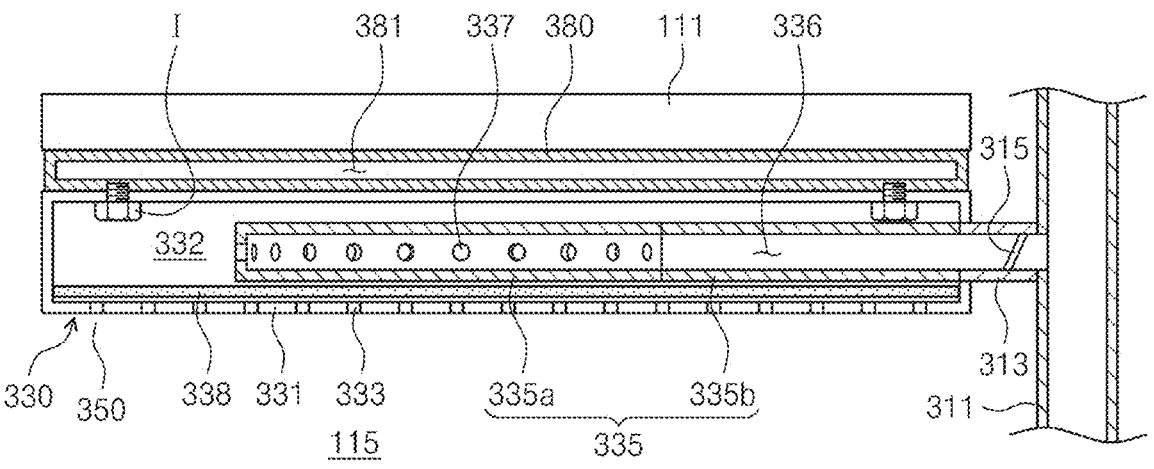
FIG. 10 is a diagram illustrating a view of a gas supply unit according to another exemplary embodiment of the present invention.
Figure 11:
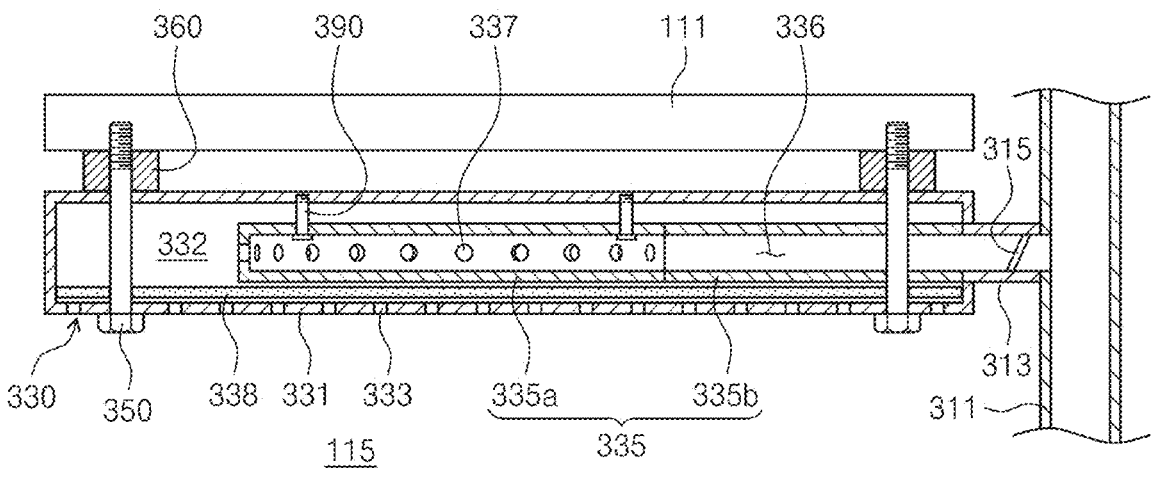
FIG. 11 is a diagram illustrating a view of a gas supply unit according to another exemplary embodiment of the present invention.

In the above-described example, it is described as an example that the ring-shaped heat insulating pad 360 is disposed between the gas supply housing 330 and the base 111, but the present invention is not limited thereto. For example, as illustrated in FIG. 10, a heat insulating housing 380 having a vacuum space 381 may be provided between the gas supply housing 330 and the base 111. The heat insulating housing 330 may be provided with the heat insulating material, e.g., the material such as urethane or PEEK, and provided to the vacuum space 381 of which the inside is a vacuum atmosphere. Since a thermal conductivity is very low in the case of vacuum, it is possible to minimize the heat of the base 111 influencing the temperature of the gas G. When the heat insulating housing 38 is provided, the gas supply housing 330 may be fixed and fastened to the heat insulating housing 380 by a fastening means I. The fastening means I may be the bolt or the screw. It is illustrated as an example that the injection unit 335a is fixed by the duct unit 335b in the above-described example, but the present invention is not limited thereto. For example, the gas supply unit 300 may further include a fixation member 390 that fixes the injection unit 335a to the first housing 331 so that the location of the injection unit 335a may be more stably fixed.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed embodiment. Further, the accompanying claims should be construed to include other exemplary embodiments as well.

What is claimed is:

1. An apparatus for processing a substrate, the apparatus comprising:

a processing unit configured to process the substrate; and a gas supply unit configured to supply a gas to the processing unit, wherein the gas supply unit includes a first housing having a first internal space, the first internal space in fluid communication with a processing space of the processing unit, a second housing in the first internal space, the second housing having a second internal space, and the second internal space in fluid communication with the first internal space, and a gas supply duct configured to supply the gas to the second internal space, wherein the processing unit includes a first processing unit and a second processing unit below the first processing unit, wherein the first housing and the second housing are between the first processing unit and the second processing unit, wherein a top surface of the first housing is spaced apart from a bottom surface of the first processing unit, and wherein the gas supply unit further includes a bolt or a screw made of a heat insulating material, the bolt or the screw fixing the first housing to the first processing unit.

2. The apparatus of claim 1, wherein the second housing includes an injection unit having at least one hole in which the gas flows, and a duct unit between the injection unit and the gas supply duct, and the duct unit having one end connected to the injection unit.

3. The apparatus of claim 2, wherein a plurality of holes including the at least one hole is formed in the injection unit.

4. The apparatus of claim 2, wherein the injection unit is at a central region of the first internal space.

5. The apparatus of claim 4, wherein the injection unit has a cylindrical shape, and the at least one hole is formed at a side portion of the injection unit.

6. The apparatus of claim 5, wherein a diameter of the injection unit is larger than a width of the duct unit.

7. The apparatus of claim 1, wherein the gas supply unit further includes a heat insulating pad installed between the first housing and the first processing unit, and the heat insulating pad made of the heat insulating material.

8. The apparatus of claim 1, wherein the gas supply unit further includes a flow rate control damper configured to control a supply flow rate of gas over time to the processing space.

9. A gas supply unit configured to supply a gas of which a temperature or humidity is configured to be controlled to a processing unit configured to process a substrate, the gas supply unit comprising:

a gas supply housing having a dual chamber structure, and having an internal space in fluid communication with a processing space of the processing unit; and a gas supply duct configured to supply the gas to the gas supply housing, wherein the gas supply housing includes a first housing having a first internal space, and a second housing in the first internal space, the second housing having a second internal space into which the gas is configured to be introduced from the gas supply duct, wherein the second housing includes an injection unit having at least one hole which makes the second internal space and the first internal space be in fluid communication with each other, wherein the injection unit has a cylindrical shape, wherein the processing unit includes a first processing unit and a second processing unit below the first processing unit wherein the first housing and the second housing are between the first processing unit and the second processing unit, wherein a top surface of the first housing is spaced apart from a bottom surface of the first processing unit, and wherein the gas supply unit further includes a bolt or a screw made of a heat insulating material, the bolt or the screw fixing the first housing to the first processing unit.

10. The gas supply unit of claim 9, wherein the gas supply housing further includes at least one perforated hole making the first internal space and the processing space be in fluid communication with each other, and the at least one perforated hole is on a surface facing the processing space of the first housing.

11. The gas supply unit of claim 10, wherein the second housing further includes a duct unit between the injection unit and the gas supply duct.

12. The gas supply unit of claim 11, wherein a diameter of the injection unit is larger than a width of the duct unit.

13. The gas supply unit of claim 11, wherein a plurality of holes including the at least one hole are formed at an upper portion, a side portion, and a lower portion of the injection unit.

14. The gas supply unit of claim 10, further comprising:

a filter between the at least one perforated hole and the second housing, and the filter configured to filter the gas.

15. The gas supply unit of claim 14, further comprising:

a flow rate control damper configured to control a supply flow rate of the gas over time to the processing space.

16. An apparatus for processing a substrate, the apparatus comprising:

a processing unit configured to form a liquid layer on the substrate by supplying an application liquid to the substrate; and a gas supply unit configured to supply gas to the processing unit, wherein the processing unit includes a chamber having a processing space, a bowl having a cylindrical shape including an open upper portion, a chuck configured to support the substrate in the bowl, a driver configured to rotate the chuck, a nozzle configured to supply the application liquid to the substrate on the chuck, and an exhaust pipe configured to exhaust the gas introduced into the bowl, and the gas supply unit includes a gas supply housing having a dual chamber structure, and having an internal space in fluid communication with the processing space, and a gas supply duct configured to supply the gas to the internal space, wherein the gas supply housing includes a first housing having a first internal space in fluid communication with the processing space, and a second housing in the first internal space, and the second housing having a second internal space in fluid communication with the first internal space, wherein the second housing includes an injection unit having at least one hole in which the gas flows, wherein the injection unit has a cylindrical shape, wherein the processing unit includes a first processing unit and a second processing unit below the first processing unit, wherein the first housing and the second housing are between the first processing unit and the second processing unit, wherein a top surface of the first housing is spaced apart from a bottom surface of the first processing unit, and wherein the gas supply unit further includes a bolt or a screw made of a heat insulating material, the bolt or the screw fixing the first housing to the first processing unit.

17. The apparatus of claim 16, wherein the second housing further includes a duct unit between the injection unit and the gas supply duct, and the duct unit having one end connected to the injection unit, wherein the injection unit is at a central region of the first internal space.

18. The apparatus of claim 17, wherein a diameter of the injection unit is larger than a width of the duct unit.

19. The apparatus of claim 16, further comprising:

a plurality of processing units including the processing unit, and a plurality of gas supply housings including the gas supply housing.

20. The apparatus of claim 19, wherein the gas supply duct is configured to supply the gas to at least two gas supply housings.

* * * * *